United States Patent [19]
Ovshinsky et al.

[11] Patent Number: 4,770,940
[45] Date of Patent: Sep. 13, 1988

[54] GLOW DISCHARGE METHOD OF APPLYING A CARBON COATING ONTO A SUBSTRATE AND COATING APPLIED THEREBY

[75] Inventors: Stanford R. Ovshinsky, Bloomfield Hills; James Flasck, Rochester, both of Mich.

[73] Assignee: Ovonic Synthetic Materials Company, Troy, Mich.

[21] Appl. No.: 908,466

[22] Filed: Sep. 17, 1986

Related U.S. Application Data

[62] Division of Ser. No. 649,324, Sep. 10, 1984, Pat. No. 4,663,183.

[51] Int. Cl.$^4$ .................. B32B 9/00; B32B 27/06; B32B 15/04; C01B 31/00
[52] U.S. Cl. ........................... 428/408; 428/412; 428/457; 428/500; 428/691; 428/696; 428/917; 423/445
[58] Field of Search ............... 428/408, 411.1, 412, 428/457, 500, 688, 690, 917; 427/39, 40, 45.1, 122; 423/445, 446, 449

[56] References Cited

U.S. PATENT DOCUMENTS

| | | | |
|---|---|---|---|
| 4,338,374 | 7/1982 | Hashimoto et al. | 428/412 |
| 4,371,585 | 2/1983 | Memon | 428/412 |
| 4,412,903 | 11/1983 | Green et al. | 428/408 X |
| 4,436,797 | 3/1984 | Brady et al. | 428/408 X |
| 4,486,286 | 12/1984 | Lewin et al. | 428/408 X |
| 4,490,229 | 12/1984 | Mirtich et al. | 423/449 X |
| 4,504,519 | 3/1985 | Zelez | 428/408 X |
| 4,597,844 | 7/1986 | Hiraki et al. | 428/408 X |

OTHER PUBLICATIONS

Aisenberg and Chabot, "Journal of Applied Physics", vol. 42, (1971), pp. 2953–2958.
Whitmell and Williamson, Thin Solid Films, 35, (1976), pp. 255–261.
Holland and Ojha, Thin Solid Films, 38 (1976) L17–19, 40 (1977) L31–L32, 48 (1978) L21–L23.

*Primary Examiner*—John E. Kittle
*Assistant Examiner*—Susan S. Rucker
*Attorney, Agent, or Firm*—Richard M. Goldman; Marvin S. Siskind

[57] ABSTRACT

Disclosed is a method of forming a hard, carbonaceous film on a substrate and the hard carbonaceous film formed thereby. The hard carbonaceous film is formed by decomposing a gaseous hydrocarbon having carbon atoms tetrahedrally coordinated to its nearest neighbors through carbon-carbon single bonds. The gaseous hydrocarbon is decomposed in a radio frequency maintained plasma and the plasma decomposition products are deposited on a cathodic substrate. Optionally, fluorocarbons may be present in a decomposition gas.

14 Claims, 3 Drawing Sheets

GLOW DISCHARGE METHOD OF APPLYING A CARBON COATING ONTO A SUBSTRATE AND COATING APPLIED THEREBY

This is a divisional of application Ser. No. 649,324 filed Sept. 10, 1984 now U.S. Pat. No. 4,633,183 issued May 5, 1987.

FIELD OF THE INVENTION

The invention disclosed herein relates to carbon coatings and to glow discharge methods of depositing carbon coatings.

BACKGROUND OF THE INVENTION

Considerable effort has been made to develop carbon containing coatings having particular desirable properties, i.e., synthetic diamond coatings, sometimes characterized as glassy diamond coatings, amorphous diamond coatings, and disordered diamond coatings. These coatings are characterized by unique photoluminescent, electroluminescent, optical, corrosion resisting, and ultimate properties. However, various problems are associated with the attainment of such "diamond like" properties. These problems are believed to be associated with microvoids, dangling bonds, a high number of carbon-hydrogen bonds, and carbon-carbon double bonding.

Two distinctly different methods of depositing carbon coatings in an attempt to avoid these problems and to attain properties associated with tetrahedral coordination are reported in the literature. In one method, described, for example, by Aisenberg and Chabot in *Journal of Applied Physics,* Vol. 42 (1971) at p. 2953, diamond-like films are deposited using an ion beam of carbon produced in an argon plasma and then introduced into a low vacuum vessel. While the reported hardness, electrical resistivity and chemical inertness of the films and coatings produced thereby are reported to be satisfactory, the production rate of the method was reported to be low.

Subsequently, Whitmell and Williamson demonstrated a method of obtaining hard carbon containing films by cracking a gaseous, linear hydrocarbon in a direct current glow discharge. In the Whitmell and Williamson process described in D. S. Whitmell and R. Williamson *Thin Film Solids,* Vol. 35 (1976) at p. 255, the substrate is placed on a negatively biased target electrode and the direct current plasma exposes the substrate to a hydrocarbon gas decomposing plasma.

Subsequently, Holland and Ojha developed a process described in *Thin Film Solids,* Vol. 38 (1976) at p. L-17, *Thin Film Solids,* Vol. 40 (1977) at p. L-31, and *Thin Film Solids,* Vol. 48 (1978) at p. L-21. In the process of Holland and Ojha, hard, carbon containing films are obtained by cracking gaseous linear hydrocarbons in a radio frequency glow discharge. In the process of Holland and Ojha, the substrate is placed on a negatively biased target electrode and the radio frequency excited plasma exposes the substrate to positive ions and to electrons alternately. This prevents any net charge accumulation on the insulating deposits The reported hardness, electrical resistivity, optical absorbtion, chemical inertness, and index of optical refraction of the films produced by the method of Holland and Ojha indicated a disordered structure characterized by the substantial absence of carbon hydrogen bonds and the postulated presence of a small number of tetrahedral, four-fold, carbon-carbon coordination in an otherwise graphitic structure.

SUMMARY OF THE INVENTION

According to the invention herein contemplated, there is provided a method of obtaining hard carbonaceous films characterized by the absence of long range order, the resulting long range disorder include inter alia, intersections of graphitic planes, and short range order including three-fold graphitic coordination and four-fold tetrahedral coordination, e.g. at sites of intersecting and/or puckering of graphitic planes. The hard, carbonaceous films exhibit properties that approach those heretofore associated with crystalline carbon having tetrahedral, four-fold, carbon-carbon coordination. These films are referred to as "tetrahedral-like", and "diamond-like" and are characterized by clarity, hardness, and especially the combination of low electrical conductivity, transparency, and optical band gap heretofore associated with tetrahedral coordination.

The low temperature method comprises the steps of decomposing a gaseous hydrocarbon under conditions where deposition of a solid film having long range disorder and short range trigonal and tetrahedral coordination is formed. These conditions include one or more of the following: (1) decomposing a reaction gas containing a hydrocarbon compound having carbon atoms tetraedrally coordinated to its nearest neighbors through carbon-carbon bonds; (2) including a fluorine containing compound in the reaction gas; (3) depositing the film on a cathodically biased substrate; and (4) applying energy to raise the bonding levels in the carbon atoms, i.e., expanding the normally available bonding orbitals, as by applying separate d.c., radio frequency, or ion beam self biasing means to the substrate. The reaction gas is decomposed in a radio freouency maintained plasma, i.e., a glow discharge plasma, and the plasma decomposition products thereof are deposited on a substrate.

The herein contemplated coatings formed by glow discharge assisted decomposition of gaseous hydrocarbons, especially one having tetrahedral coordination of carbon atoms, optionally in the presence of fluorine, and the subsequent deposition thereof on a substrate, preferably a cathodically biased substrate, results in an adherent, hard, tetrahedral like, inert coating. It is believed that the presence of tetrahedral coordination of carbon atoms in the precursor hydrocarbon gas acts as a template for replication of four-fold carbon-carbon co-ordination in the deposited film.

The principles involved in this invention can be applied to various types of disordered carbon films, for example characterized by thickness, e.g. from several tens of angstroms thick, or thick films e.g. several tens of microns thick, or to the intended application of the film as an abrasion resistant coating, a corrosion resistant coating, or a coating including a wide band gap coating, film, or layer for semiconductor devices.

The coatings herein contemplated are useful as abrasion resistant coatings on plastic, for example hard, transparent or transparent to yellow adherent coatings on polycarbonates such as General Electric "LEXAN", polyacrylates such as stretched polyacrylates, and poly(allyl carbonates) such as poly(diethylene glycol(bis(allylcarbonate)) useful for optical and opthalmic applications.

Coated polycarbonate articles may be used as windshields, for example automotive windshields while coated polyacrylate substrates, such as stretched polyacrylate substrates, may be used for aircraft windows.

The disordered carbon coatings herein contemplated may further be used in conjunction with electronic devices.

The herein contemplated coatings of deposited disordered carbon may be utilized in electroluminescent and photoluminescent devices.

The herein contemplated coatings may further be used as corrosion resistant coatings, for example on substrates susceptable to corrosion. The coatings herein contemplated show resistance to hydrofluoric acid, sulfuric acid, nitric acid, acetic acid, mixtures of hydrochloric and nitric acid, mixtures of hydrofluoric and nitric acid, hydrogen peroxide, mixtures of hydrogen peroxide and caustic soda, mixtures of sulfuric acid and hydrogen peroxide, cyanides and the like. The contemplated coatings, when intended for use as corrosion resistant coatings, should be substantially pin-hole free.

The herein contemplated coatings may be utilized as wear resistant coatings for tools, rolling surfaces, bearing surfaces, and the like.

Coatings herein contemplated also find use as coatings on electrostatic photographic drums.

THE FIGURES

DETAILED DESCRIPTION OF THE INVENTION

The invention herein contemplated includes a method of forming hard, carbonaceous tetrahedral like films and the hard films prepared thereby. The films are characterized by the absence of long range order. The disordered films are substantially equivalent to crystalline carbon films, and have a long range disordered structure of bent, intersecting, and puckered three-fold coordinated, graphitic lamina; with short range order including tetrahedral, four-fold carbon-carbon coordination, e.g., at intersections of graphitic planes, a low concentration of C—H bonds, and the substantial absence of linear polymers, on a substrate. The hard carbonaceous film is a carbon-hydrogen alloy formed by a process of decomposing a reaction gas containing at least gaseous hydrocarbon in a radio frequency maintained plasma, i.e., a glow discharge, and depositing the decomposition products on a substrate. The substrate may be a cold substrate; that is, it need not be externally heated.

The preferred gaseous hydro-carbons are characterized by having carbon atoms tetrahedrally coordinated to its nearest neighbors through carbon-carbon bonds. It is believed that the tetrahedral coordination of carbon to its nearest neighbor atoms through carbon-carbon single bonds in the precursor gas acts as a template for the replication of four-fold carbon-carbon co-ordination in the deposited film. Exemplary gaseous hydrocarbons are x,x-dialkyls having the formula

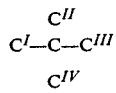

where C represents a four-fold coordinated central carbon atom and $C^I$, $C^{II}$, $C^{III}$ and $C^{IV}$ represent methyl groups, alkyl groups, and mixtures thereof A particularly preferred compound is 2,2-dimethyl propane having the formula

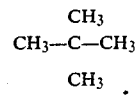

where $C^I$, $C^{II}$, $C^{III}$ and $C^{IV}$ are all methyl groups. Other hydrocarbons having tetrahedrally coordinated central carbon atoms include 2,2-dimethyl butane, and 2,2,3,3-tetramethyl butane as well as higher homologs thereof It is believed that the presence of a halogen compound, especially a fluorine compound, in the reaction gas e.g., a hydrocarbon gas, whether or not the hydrocarbon gas contains carbon atoms four-fold coordinated with other carbon atoms, enhances both tetrahedral coordination of carbon and the presence of an effective amount of hydrogen in the film. Moreover, the presence of hydrogen reduces the tendency of the fluorine to etch the deposit. When the halogen is fluorine. Suitable fluorine compounds include perfluorocarbons, e.g., $C_nF_{2n+2}$ where n is from 1 to about 8, and exemplified by carbon tetrafluoride, fluorinated hydrocarbons, e.g., $C_nF_{2n+2-m}H_m$ where n 1 to about 8, and m is less than $2n+2$, and exemplified by the fluoromethanes and fluoroethanes, and HF.

Figure 2:
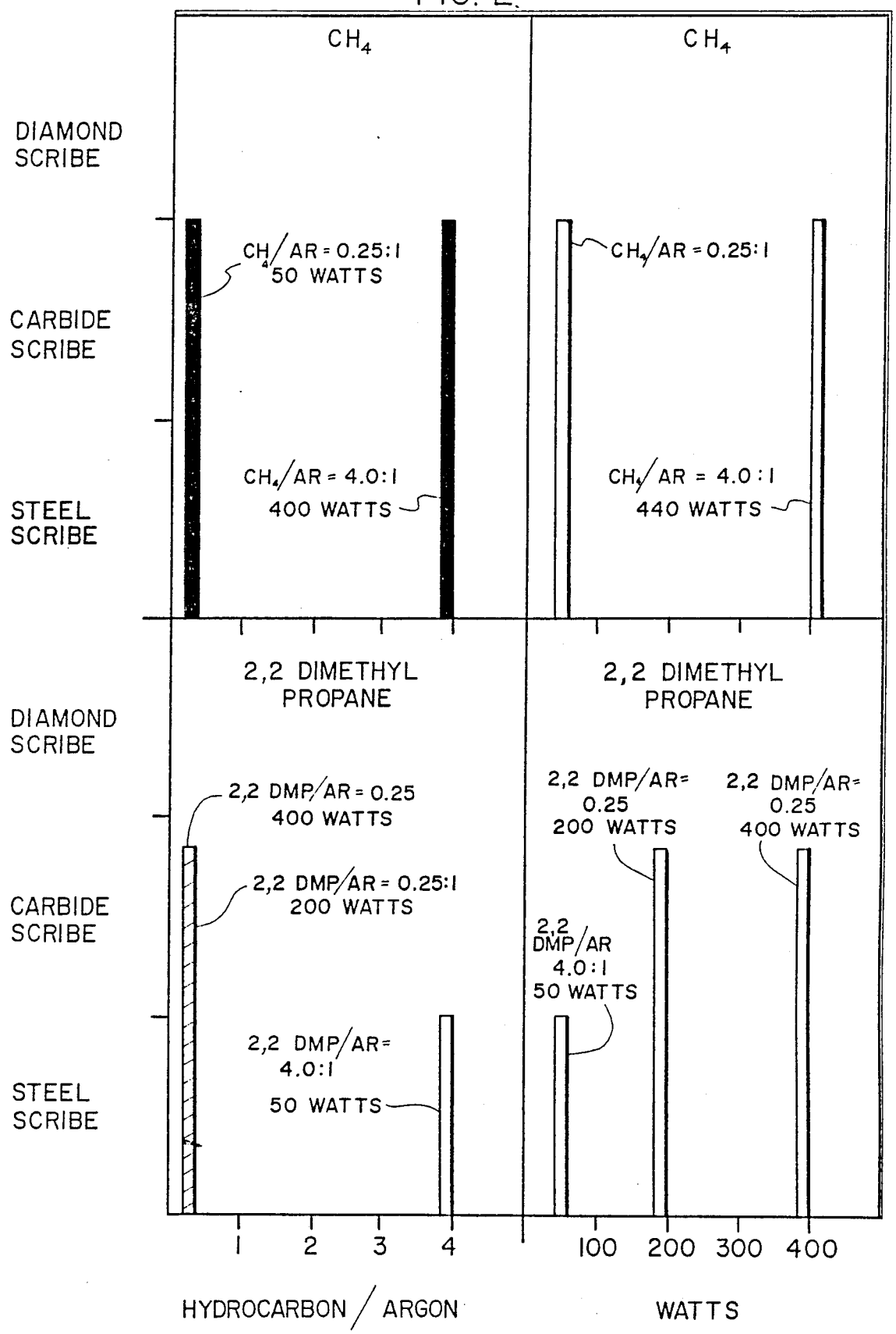
FIG. 2 is a graphical representation of the relative hardness of the coatings produced by the method of this invention versus the hydrocarbon-carrier ratio.

According to the glow discharge method herein contemplated, the gaseous hydrocarbon (including the optional halogen, e.g. fluorocarbon) is in a gas mixture with inert gas. The inert gas may be helium, argon, neon, xenon or mixtures thereof. Preferably the inert gas is argon. The atomic ratio of the gaseous hydrocarbon to the carrier gas is from about 0.1:1.0 to about 10.0:1.0, depending on the desired properties of the deposited carbon film. As shown in FIG. 2, hardness is a strong function of the ratio of hydrocarbon to argon. Thus, where the atomic ratio or volume ratio of hydrocarbon to argon is about 10:1, a relatively soft carbonaceous film is attained. When the volume ratio of hydrocarbon to argon is less thad about 1.0/1, a relatively hard carbonaceous film is attained. When it is desired to obtain a relatively hard carbonaceous film, the volume ratio of hydrocarbon to argon is from about 0.1:1 to about 1:1.

Figure 1:
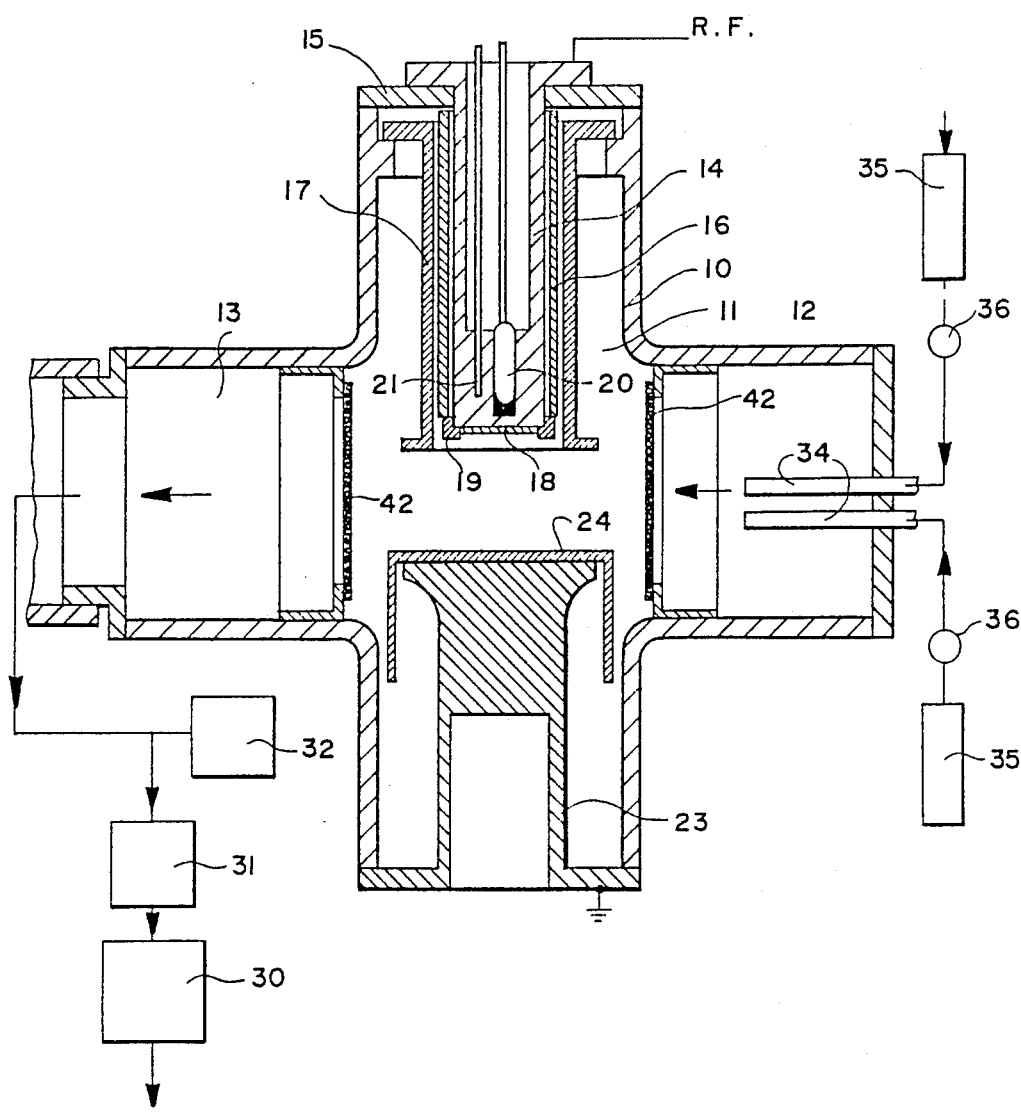
FIG. 1 is a diagrammatic illustration of the apparatus for the glow discharge decomposition of a reaction gas containing gaseous hydrocarbons and deposition of the resulting glow discharge decomposition product onto a cathodically biased substrate.

A method and apparatus for depositing the disordered carbon by glow discharge deposition are illustrated in FIG. 1. The apparatus includes a housing 10 having a vacuum chamber 11 and in inlet chamber 12 and an outlet chamber 13. A cathode backing member 14 is mounted in the vacuum chamber 11 through an insulator 15 and is provided with an insulating sleeve 16 and a dark space shield 17. A substrate 18, i.e., a cathodically biased substrate is secured to the inner end of the cathode backing member 14 by a substrate holder 19 which may be joined to the cathode backing member 14 it electrical contact therewith.

The cathode backing member 14 may be provided with a well receiving an electrical heater for heating the cathode backing member 14'. However this is not necessary as the disordered carbon films may be deposited at room temperature on the contemplated low temperature process. When the cathode backing member 14 has a well for receiving an electrical heating element 20, the cathode backing member 14 may further have a temperature responsive probe 21, e.g., a thermocouple, for measuring the temperature of the cathode backing member.

The glow discharge decomposition apparatus further includes an electrode 23 secured on the vacuum chamber 11 and spaced from the cathode backing member 14. The electrode 23 is provided with a shield 24.

The space in the vacuum chamber 11 between the cathode backing member 14 and the electrode 23 provides space for glow discharge conditions therebetween. In this way, there is produced a plasma within the vacuum chamber 11 between the cathode backing member 14 and the electrode. As herein contemplated, the cathode is electrically connected to a source of radio frequency power which may be regulated. The electrode 23 is grounded whereby to provide the desired glow discharge therebetween.

The vacuum chamber 11 may be evacuated by a vacuum pump 30 and particle trap 31 and pressure gauge 32 indicating the vacuum pressure in the vacuum chamber.

The inlet chamber 12 of the housing 10 may be provided with a plurality of conduits for introducing materials into that housing 10. For example, in addition to the hydrocarbon gas, there may be provided fluorinated hydrocarbon gases or fluorocarbon gases whereby to provide fluorine in the deposited coating for substantially eliminating dangling bonds and providing a carbon-fluorine or carbon-fluorine-hydrogen alloy.

The inlet chamber 12 may be located remote from the vacuum chamber 11 for premixing the gases before they are fed into the vacuum chamber 11 of the housing. Thus, the gases, as the hydrocarbon gas and the fluorocarbon gas, may be fed to conduit 34 through filters or purifying devices 35 through suitable control means 36. The control means controls the rate of admission of materials into the vacuum chamber 11. The materials fed through the conduit 34 and mixed in the inlet chamber 12 are subjected to the glow discharge composition between the cathode 14 and the electrode 23 in the vacuum chamber 11. This provides the desired gow discharge decomposition and the formation of the disordered, diamond-like carbon on the substrate 18, optionally with the incorporation of the desired alterants or modifying elements therein as hydrogen and fluorine.

The method herein contemplated may also be carried where the substrate is a moving, continuous web, and the deposition is substantially continuous. For example, the process may be carried out with a deposition means including multichamber depositions, i.e., to provide a vertically arrayed structure.

According to the method herein contemplated, the system is pumped down to a pressure less than about $5 \times 10^{-8}$ torr prior to deposition. Thereafter, a hydrocarbon gas optionally with a carrier as an inert gas such as helium, argon, neon, or a mixture thereof, and optionally with fluorocarbon gases as tetrafluoromethane, (carbon tetrafluoride) difluoromethane or the like are fed into the inlet chamber 12 through one of the conduits 34. The gas mixture is fed at a constant rate of about 100 standard cubic centimeters per minute total gas into the vacuum chamber 11. The vacuum chamber is maintained at a total pressure of about 50 to about 500 millitorrs and preferably from about 100-300 millitorr.

The partial pressure in the vacuum chamber 11 of the gases introduced therein provides a reactive atmosphere which contains the hydrocarbon and fluorocarbon gases as well as the carrier gas, e.g., argon. A plasma is generated in the atmosphere between the electrode and the cathode using a radio frequency power of at least 50 watts and preferably up to 500 watts, operating at a radio frequency of from above about 0.1 megahertz, and generally for reasons of operational convenience, at about 13.56 megahertz.

By "radio frequency", also referred to herein as "r.f.", is meant that portion of the electromagnetic spectrum having frequencies between the audio portion of the electromagnetic spectrum and the far infrared portion of the electromagnetic spectrum, i.e., from 0.1 megahertz to about 100 gigahertz, and wavelenghts corresponding thereto of from about $3 \times 10^3$ meters for 0.1 megahertz radiation to $3 \times 10^{-3}$ meter for 100 gigahertz radiation, and including "microwave" radiation.

By "microwave" is meant that portion of radio frequency radiation having frequencies in the gigahertz range, i.e., above about 1 gigahertz (which is the generally accepted definition found in the *IEEE Standard Dictionary of Electrical and Electronics Terms*, F. Jay, editor, IEEE, New York, N.Y. (1977) at page 416) and wavelengts corresponding thereto of less than about $3 \times 10^{-1}$ meter for 1 gigahertz radiation. The upper range of microwave radiation is less than the frequencies and wavelengths of the "far infrared" portion of the electromagnetic spectrum.

In the process, argon ions are attracted to the cathode and break the carbon hydrogen bonds. A subsequent carbon atom comes down to the substrate to take the place of the hydrogen. It is believed that the interaction of fluorine and hydrogen promotes the four-fold, tetrahedral, carbon-carbon coordination while avoiding etching by the fluorine.

Additionally, the application of bias energy to raise the bonding levels in the carbon atoms, that is, to expand the normally available bonding orbitals, and enhances both the tetrahedral-likeness of the coating and the rate of film growth. The energy may be applied by applying a d.c. field or bias across the deposition electrodes, by applying an r.f. field across the deposition electrodes, or even by applying an ion beam to deposit film. Thus, an external ion beam may be directed onto the substrate and/or growing film during film deposition whereby to get ion bombardment during deposition.

The process is carried out to form a coating of from about 100 angstroms to about 100 microns thick, and preferably from about 200 angstroms to about 20 microns in thickness. When coatings are prepared as described hereinabove, the disordered carbon coatings cannot be scratched with a steel or carbide scribe.

The resulting deposited coatings, when subjected to Raman spectropscopy and to electron diffraction microscopy, indicated a disordered structure. Infrared spectropscopy indicated the low levels of C—H bonds, i.e., detectable by infrared spectroscopy and up to about 1 atomic percent of hydrogen.

As the power applied to the plasma increases, i.e. from less than about 50 watts to 500 or more watts, the hydrogen in the deposit decreases, and the deposit gets darker and harder. Similarly, when the ratio of hydrocarbon gas to argon decreases, the hardness increases.

The deposit is prepared at a low temperature, i.e., with the substrate at about 20° to 100°, although high temperatures may be utilized without deleterious effect.

The method of the invention may be utilized to provide forming a hard carbonaceous film on a polymeric substrate. Suitable polymeric substrates include polycarbonates as General Electric "LEXAN", polyacrylates as stretched polyacrylates used in aircraft windows, and poly(allylcarbonate) as used in opthalmic and optical lenses.

The method herein contemplated may also be used for forming hard carbonaceous films having semiconductor properties, e.g., a band edge, on a semiconductor device. The hard coating has an optical band gap intermediate that of graphite and of diamond, e.g., from about 0.1 to about 3.5 electron volts, and preferably from about 0.7 to 2.9 electron volts depending upon the deposition parameters and deposition gas concentration. As such, it may be used as an antireflective coating as well as an abrasion resistant coating on a photoresponsive semiconductor device. Particularly preferred is a deposit having an optical band gap of from about 1.3 to about 2.5 electron volts.

The method herein contemplated may further be used to provide a hard carbonaceous film on a metallic substrate, for example, a substantially pin-hole free, corrosion resistant, surface or a semiconducting film on a conducting plate whereby to provide an electrostatic imaging surface.

The following examples are illustrative of the method of this invention.

EXAMPLE I

A series of tests were carried out to compare glow discharge deposition of methane to glow discharge deposition of 2,2-dimethyl propane. In all cases, the deposit was formed by pumping a deposition chamber down to a pressure of less than $5 \times 10^{-8}$ torr, forming a reaction gas of the gaseous hydrocarbon and argon, and passing the gaseous hydrocarbon through the vacuum chamber, with the sample on the cathode at the power indicated. The radio frequency was 13.56 megahertz.

In the first test, methane was passed through the deposition chamber at a ratio of methane to argon of about 4/1. The deposition was carried out at a power of from about 50 watts. The deposit had an electrical resistance at 27° centigrade of about $6 \times 10^{12}$ (ohm centimeters), and an optical band gap of 2.2 electron volts.

The above example was repeated at a power of about 50 watts and a ratio of methane to argon of about 1/1. The resulting film was a transparent-yellow, hard film with an electrical resistivity at 27° C. of about $1 \times 10^{10}$ (ohm-centimeters) and an optical band gap of 1.4 electron volts.

The above example was repeated at a power of about 400 watts and a ratio of methane to argon about 1/1. The resulting film was black and substantially opaque and had an electrical resistivity of about $4 \times 10^6$ (ohm-centimeters), and had an optical band gap of about 0.73 electron volts.

EXAMPLE II

Thereafter, the example was repeated with 2,2-dimethyl propane at a ratio of hydrocarbon to argon of 1/1 and a power of about 50 watts. The resulting surface was "soft", very transparent, had an electrical resistivity of above about $10^{12}$ (ohm centimeters), and had an optical band gap of about 2.9 electron volts.

The run was repeated at a power of about 200 watts and a 2,2-dimethyl propane to argon ratio of about 0.1/1. lhe resultng surface was a hard surface having about 40 percent optical absorbtion at a thickness of 9000 angstroms, an electrical resistivity of about $10^{10}$ (ohm-centimeters), and an optical band gap of about 1.3 electron volts, and an index of refraction of 2.3 to 2.4.

The above run was again repeated at a 2,2-dimethyl propane to argon ratio of about 0.25/1 and a radio frequency power of about 400 watts. The resulting film had an optical transmissivity of about 0 at 1 micron thickness, an electrical resisitivity of about $3 \times 10^8$ (ohm centimeter), and an optical band gap of about 0.7 electron volt.

EXAMPLE III

Example I was repeated with a reaction gas of methane-carbon tetrafluoride-argon at a volume ratio of 9:10:10. Deposition was carried out at a power of 50 watts. The resulting film had an optical band gap of 2.0 electron volts.

The above run was then repeated with a reaction gas having a methane-carbon tetafluoride-argon ration of 1:1:2. Deposition was carried out at a power of 50 watts. The resulting film had an optical band gap of 2.4 to 3.3 electron volts.

GRAPHICAL REPRESENTATION OF DATA

The qualitative hardness data of Example I and 11 are reproduced in FIG. 2.

Figure 3:
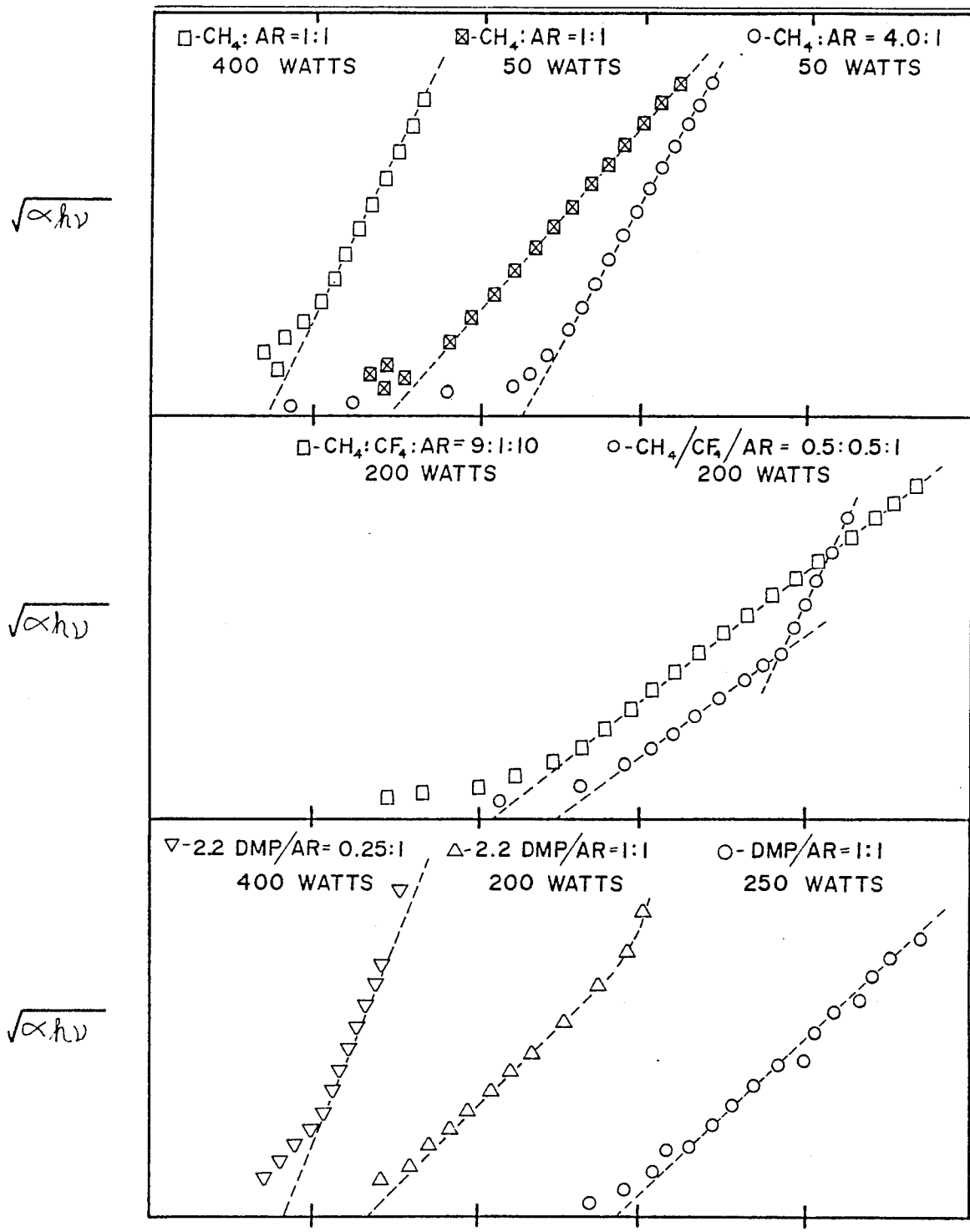
FIG. 3 is a graphical representation of the optical band gap for carbon and for silicon, both produced by glow discharge deposition.

The optical band gap data of Examples I, II, and III are reproduced in FIG. 3.

While the invention has been described with respect to certain preferred exemplifications and embodiments thereof, it is not intended to limit the scope of the protection thereby but solely by the claims appended hereto.

We claim:

1. A semiconductor device having a semiconductor substrate body and a film thereon comprising an alloy of carbon and hydrogen, said alloy having (1) long range disorder, and (2) properties of the type associated with local order of the type characterized by tetrahedral, four-fold carbon-carbon coordination, including an optical band gap of 0.7 to 2.9 electron volts, and an electrical resistivity of $10^8$ to $10^{12}$ ohm-centimeters, said film comprising carbon deposited on the semiconductor device by glow discharge decomposition of a reaction gas comprising at least: (a) a gaseous x,x-dialkyl hydrocarbon compound having at least one carbon atom in tetrahedral coordination with four nearest neightbor carbon atoms through four carbon-carbon single bonds and (b) a fluorine compound; while maintaining the semiconductor device at a temperature of 20° C. to 100° C., whereby to provide four-fold tetrahedrally coordinated carbon through carbon-carbon single bonds in the film.

2. A coated article having a substrate and a film thereon comprising an alloy of carbon and hydrogen, said alloy having (1) long range disorder, and (2) properties of the type associated with local order of the type characterized by tetrahedral, four-fold carbon-carbon coordination, including an optical band gap of 0.7 to 2.9 electron volts, and an electrical resistivity of $10^8$ to $10^{12}$ ohm-centimeters, said film comprising carbon deposited on the substrate by glow discharge decomposition of a reaction gas comprising (a) at least a gaseous x,x-dialky hydrocarbon compound having at least one carbon atom in tetrahedral coordination with four nearest neighbor carbon atoms through four carbon-carbon single bonds, and (b) a fluorine compound, while maintaining the substrate at a temperature of 20° C. to 100° C., whereby to incorporate fluorine into the film during the deposition thereof to yield a fluorine containing solid film and to provide four-fold tetrahedrally coordinated carbon through carbon-carbon single bonds in the film.

3. The coated article of claim 2, wherein the fluorine compound is a fluorocarbon compound.

4. The coated article of claim 2 wherein the film is biased during deposition thereof.

5. The coated article of claim 4, wherein the film is deposited by radio frequency maintained glow discharge deposition.

6. The coated article of claim 5, wherein the film is d.c. biased.

7. The roated article of claim 5, wherein the film is r.f. biased.

8. The coated article of claim 5 comprising applying an ion beam to the film.

9. The coated article of claim 2, wherein the substrate is a metallic substrate.

10. The coated article of claim 2, wherein the substrate is a semiconductor substrate.

11. The coated article of claim 2 wherein the substrate is an organic polymeric substrate.

12. The coated article of claim 11, wherein the organic polymeric substrate is a poly (acrylate) substrate.

13. The coated article of claim 11, wherein the organic polymeric substrate is a poly (allyl carbonate) substrate.

14. The coated article of claim 11, wherein the organic polymeric substrate is a poly (carbonate) substrate.

* * * * *